United States Patent [19]

Nowak et al.

[11] Patent Number: 6,100,153
[45] Date of Patent: Aug. 8, 2000

[54] RELIABLE DIFFUSION RESISTOR AND DIFFUSION CAPACITOR

[75] Inventors: Edward J. Nowak, Essex; Xiaowei Tian; Minh H. Tong, both of Essex Junction, all of Vt.

[73] Assignee: International Business Machines Corporation, Armonk, N.Y.

[21] Appl. No.: 09/008,875

[22] Filed: Jan. 20, 1998

[51] Int. Cl.[7] .................................................. H01L 21/20
[52] U.S. Cl. ........................ 438/382; 438/383; 438/238; 438/171; 438/329; 438/330; 257/536; 257/379; 257/528
[58] Field of Search ................................. 438/238, 171, 438/329, 330, 382, 383; 257/536, 537, 528, 379

[56] References Cited

U.S. PATENT DOCUMENTS

| | | | |
|---|---|---|---|
| 3,631,313 | 12/1971 | Moore | 317/235 |
| 3,654,498 | 4/1972 | Chapron | 307/303 |
| 3,700,977 | 10/1972 | Lunn | 317/235 R |
| 3,729,662 | 4/1973 | Langdon | 317/235 R |
| 3,770,516 | 11/1973 | Duffy et al. | 148/33 |
| 3,776,786 | 12/1973 | Dunkley et al. | 148/175 |
| 4,044,371 | 8/1977 | Abdelrahman et al. | 357/28 |
| 4,228,450 | 10/1980 | Anantha et al. | 357/51 |
| 4,418,469 | 12/1983 | Fujita | 29/577 C |
| 4,609,935 | 9/1986 | Kondo | 357/51 |
| 4,663,647 | 5/1987 | Bertotti et al. | 357/51 |
| 4,990,461 | 2/1991 | Onozawa | 438/238 |
| 5,108,945 | 4/1992 | Matthews | 438/384 |
| 5,356,825 | 10/1994 | Hozumi et al. | 437/60 |
| 5,608,259 | 3/1997 | DeShazo et al. | 257/547 |
| 5,888,875 | 3/1999 | Lasky | 438/382 |

FOREIGN PATENT DOCUMENTS

| | | |
|---|---|---|
| 06338589 | 12/1994 | Japan . |
| 08139274 | 5/1996 | Japan . |

*Primary Examiner*—David Hardy
*Assistant Examiner*—N. Drew Richards
*Attorney, Agent, or Firm*—Eugene I. Shkurko

[57] ABSTRACT

A diffusion resistor is provided that utilizes the block mask to cover only the intrinsic polysilicon gate region. The n-type source/drain doping is implanted in the contact regions, but not in the intrinsic polysilicon gate region. A N-type (or P-type) diffusion resistor in P-well (or N-well) is provided that utilizes a block mask to cover only the intrinsic polysilicon gate region. The N-type (or P-type) source/drain doping is implanted in the contact regions but not in the intrinsic polysilicon gate region. The P-well (or N-well) block mask is used to keep the P-well (or N-well) from forming under the buried resistor. This makes the parasitic capacitance of the diffusion junction very low. Also provided is a buried capacitor and method of making both a buried resistor and a buried capacitor.

2 Claims, 4 Drawing Sheets

RELIABLE DIFFUSION RESISTOR AND DIFFUSION CAPACITOR

FIELD OF THE INVENTION

The invention pertains to diffusion resistors and buried capacitors used in semiconductor manufacturing.

BACKGROUND OF THE INVENTION

The buried resistor, also called a diffusion resistor, has been used in MOS circuits. In CMOS technology, a buried resistor consists, for example, of a N-type doped region in a P-well, with an intrinsic (or doped) polysilicon layer overlying the N-doped region which is isolated from the polysilicon by an oxide layer. The length of the resistor is defined by the polysilicon which is formed at the same time as the MOS device polysilicon gate. Known in the art are two types of buried resistors: (1) one with a block mask covering the entire resistor region and (2) one without such a mask. The block mask prevents the source and drain doping from entering the resistor region. Without the block mask, the N-type source and drain doping will be applied to the resistor terminal region resulting in heavily doped polysilicon.

The manufacturing of the buried resistor is compatible with MOS technology. The polysilicon and the isolation oxide layer are done along with the MOS device formation. The sheet resistance can be accurately and tightly controlled.

The buried resistor with the block mask has certain characteristics only some of which are desirable. First, this type of buried resistor has low gate capacitance and good reliability. These are desirable characteristics. Among the undesirable characteristics are the following. First, the input and output terminals of the buried resistor with the block mask tend to form an undesirable non-ohmic contact when the block mask is used. This disadvantage becomes significant as the buried resistor gets shorter. Second, the end resistance or spreading resistance is high without the source and drain doping. The large spreading resistance makes the layout inefficient since one has to make the resistor width wide to keep the length/width ratio small. A third disadvantage is that the parasitic buried resistor junction capacitance is high. Finally, there is significant chip-to-chip variation of the short resistor.

The buried resistor without a block mask has lower spreading resistance, good ohmic contact, and less variation from chip to chip. Since the polysilicon is highly doped, it has the following undesirable characteristics: (1) poor reliability due to the high field across the oxide, and (2) the parasitic capacitance of the buried resistor to polysilicon layer is high.

Furthermore, both types of resistor designs, i.e., with and without a block mask, have high parasitic junction capacitance.

FIG. 1 shows a prior art buried resistor cross-section 10 without the block mask. FIG. 2 shows a prior art buried resistor layout 30 with a layer of block mask 32. More particularly, FIG. 1 shows buried resistor cross section 10. Buried resistor 12 is N+ doped. Input 14 and output 16 are at the top of buried resistor 12. In between input 14 and output 16 lies N+ S/D doped polysilicon gate 18. A P-well 20 lies under buried resistor 12. N+ source/drain doping have been added under the input 14 and output 16 terminals and in the intrinsic polysilicon gate 18. The area marked 24 is the shallow trench isolation for the buried resistor 10. FIG. 1 has no block mask.

FIG. 2 shows a prior art buried resistor layout 30 with the block mask 32. The block mask 32 covers the entire buried resistor 34. Input terminal 36 is on the left of intrinsic polysilicon gate 38. Output terminal 40 is to the right of intrinsic polysilicon gate 38.

SUMMARY OF THE INVENTION

The object of the present invention is to provide a diffusion resistor design that combines all the desirable features of the prior art resistors shown in FIGS. 1 and 2 and minimizes the undesirable characteristics without altering the manufacturing steps in a way which would increase the cost of the manufacturing.

Accordingly, a buried resistor is provided that utilizes a block mask which covers only the intrinsic polysilicon region. Thus, the n-type source/drain doping will be applied to the resistor terminal region (or contact region) but not in the intrinsic polysilicon region. This reduces the parasitic diffusion-to-polysilicon capacitance, improves the reliability performance, ensures the good ohmic contact, and keeps the spreading resistance low.

Additionally, utilizing the existing P-well blocking mask, which normally is used in conjunction with the N-well, on the buried resistor region prevents a P-well from forming under the buried resistor. This reduces the junction capacitance of the N-type diffusion to P-well.

A similar approach can be applied to a buried capacitor design. In the capacitor, a block mask is used to exclude the P-well implant under the buried capacitor. The resulting buried capacitor thus has much lower parasitic junction capacitance than what is found in the present state of the art.

The invention also encompasses a method of forming a buried resistor and a method of forming a buried capacitor as described above.

DETAILED DESCRIPTION OF A PREFERRED EMBODIMENT OF THE INVENTION

Figure 3:
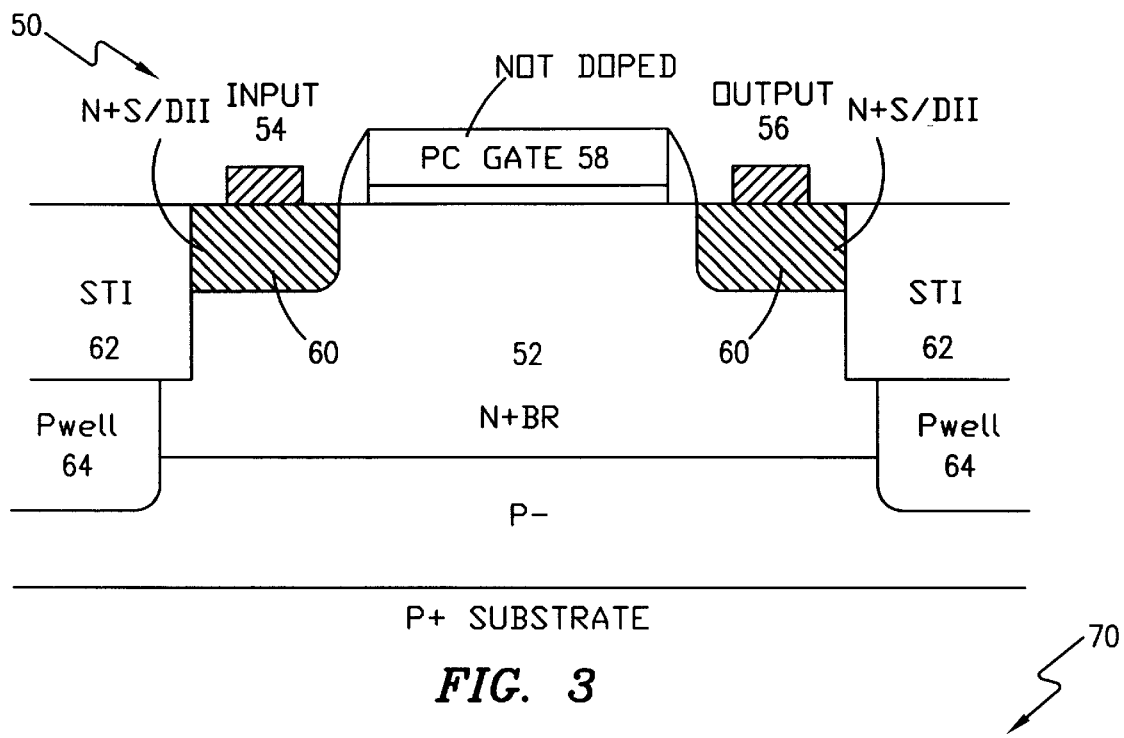
FIG. 3 is a cross section of a buried resistor made in accordance with the present invention.

The invention is best understood by reference to the drawings. FIG. 3 shows a cross-section 50 of a buried resistor 52 made in accordance with the present invention. The buried resistor 52 is N-type doped with a P-wells 64 which in FIG. 3 is bounded by shallow trench isolation ("STI"). Diffusion resistor 52 is N-type doped. The input and the output terminals 54 and 56 act as electrical contacts. N-type source/drain doping 60 is placed under the regions of the input and output terminal (54 and 56). The P-wells 64 is kept away from under the diffusion resistor 52, and thus it yields low parasitic junction capacitance.

Figure 4:
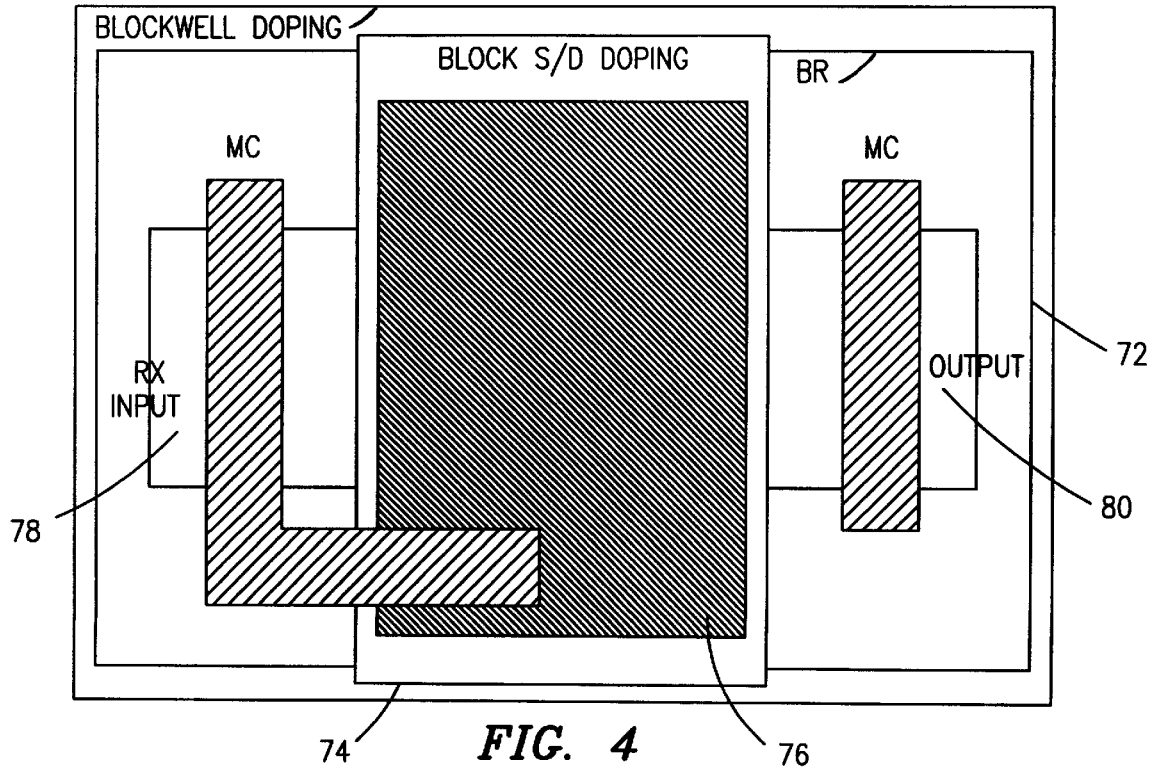
FIG. 4 is a layout of a buried resistor in accordance with the present invention.

FIG. 4 is a layout 70 of a buried resistor 72 made in accordance with the present invention. As can be seen, the block mask 74 is used only around intrinsic polysilicon gate 76. Neither input 78 nor output 80 are masked.

FIG. 4 also shows the P-well blocking mask (a BF mask) is added to the buried resistor to keep the P-well implant from entering to the resistor region.

Figure 1:
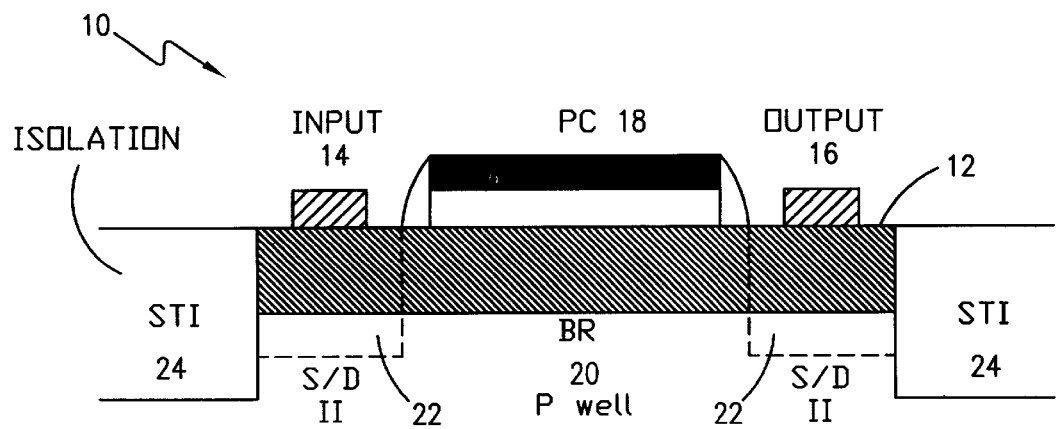
FIG. 1 shows a cross section of a prior art buried resistor without the block mask.
Figure 2:
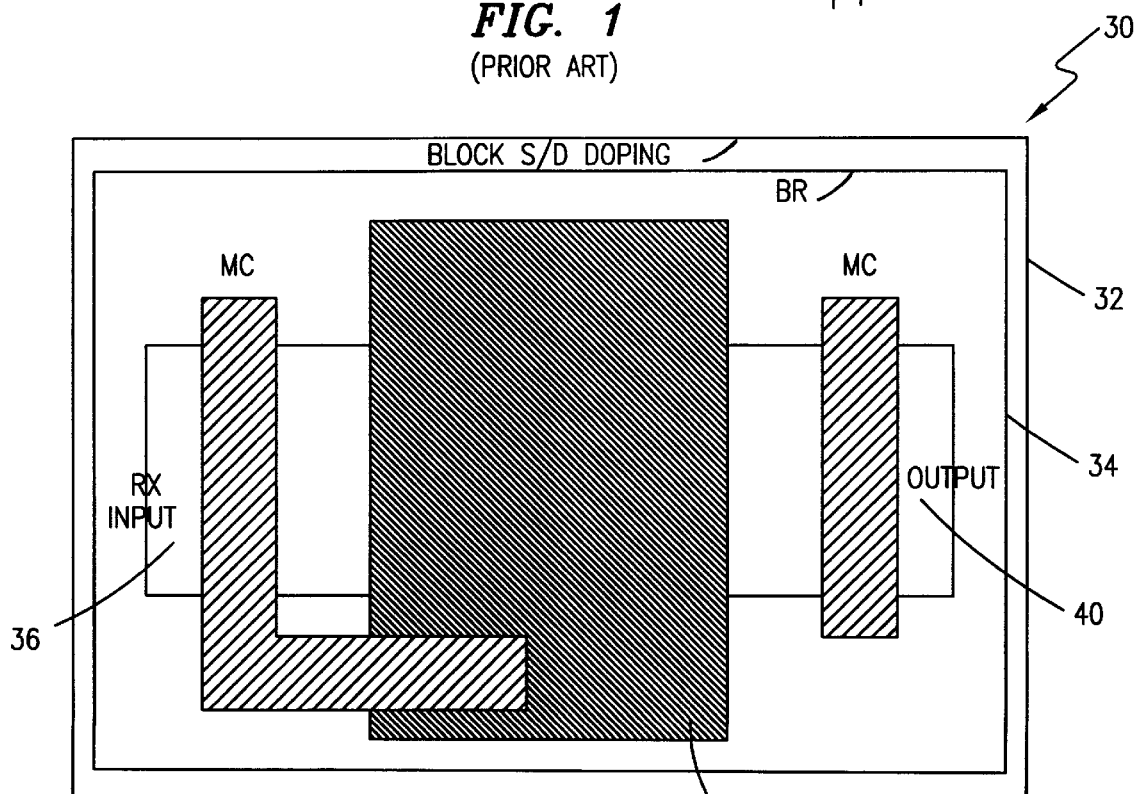
FIG. 2 shows a layout of a prior art buried resistor with the block mask.

The advantages of this design are many. The diffusion resistor of the present invention has low parasitic diffusion to polysilicon gate capacitance, low parasitic junction capacitance, high reliability, low spreading resistance, good ohmic contacts, and tighter distribution. In short, all of the advantages of both versions of the prior art shown in FIGS. 1 and 2 are present in this improved buried resistor, plus low parasitic junction capacitance.

The buried resistor of the present invention has the additional advantage that no new mask is required. Only minor design changes are needed in present manufacturing processes tog implement the invention. The invention thus can be implemented easily and without much retooling cost.

Figure 5:
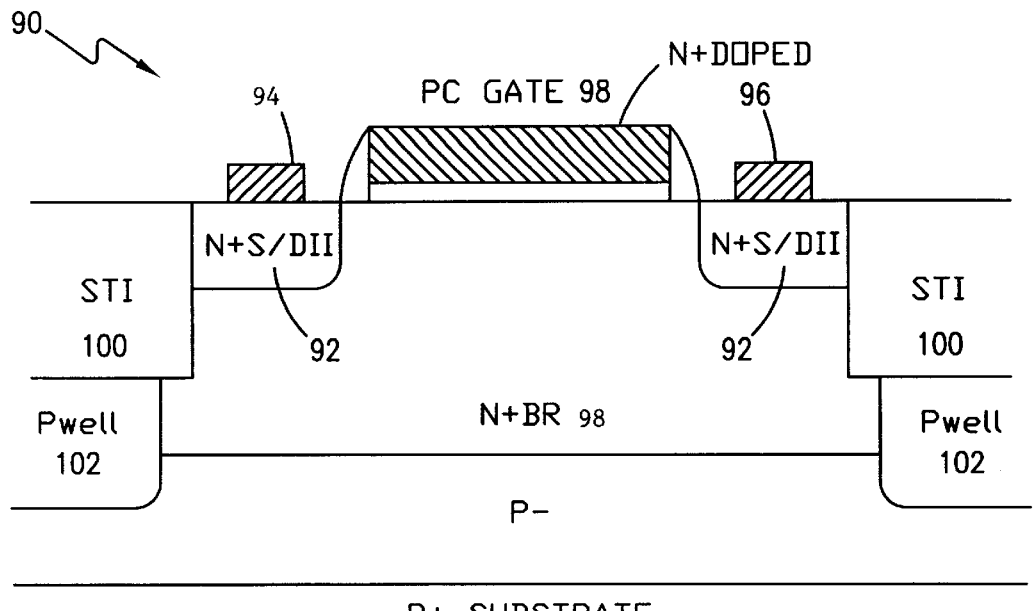
FIG. 5 is a cross section of a buried capacitor in accordance with the present invention.

FIG. 5 is a cross-section of a buried capacitor 90 manufactured in accordance with the present invention. The N+ doped diffusion region acts as one end of the capacitor and is connected out through terminals 94 and 96. The highly N+ doped polysilicon gate 98 is the other terminal of the capacitor. The area of the capacitor is defined by the polysilicon gate and is isolated through the shallow trench isolation 100. There is no Pwell under the N+ BR region 98. P-wells 102 remain, however, under the shallow trench isolation 100. A block mask 104 (in FIG. 6) is used to exclude the P-well implant under the capacitor region. The resulting gate-to-diffusion-buried capacitor has much lower parasitic junction capacitance than what is found in the present state of the art.

Figure 6:
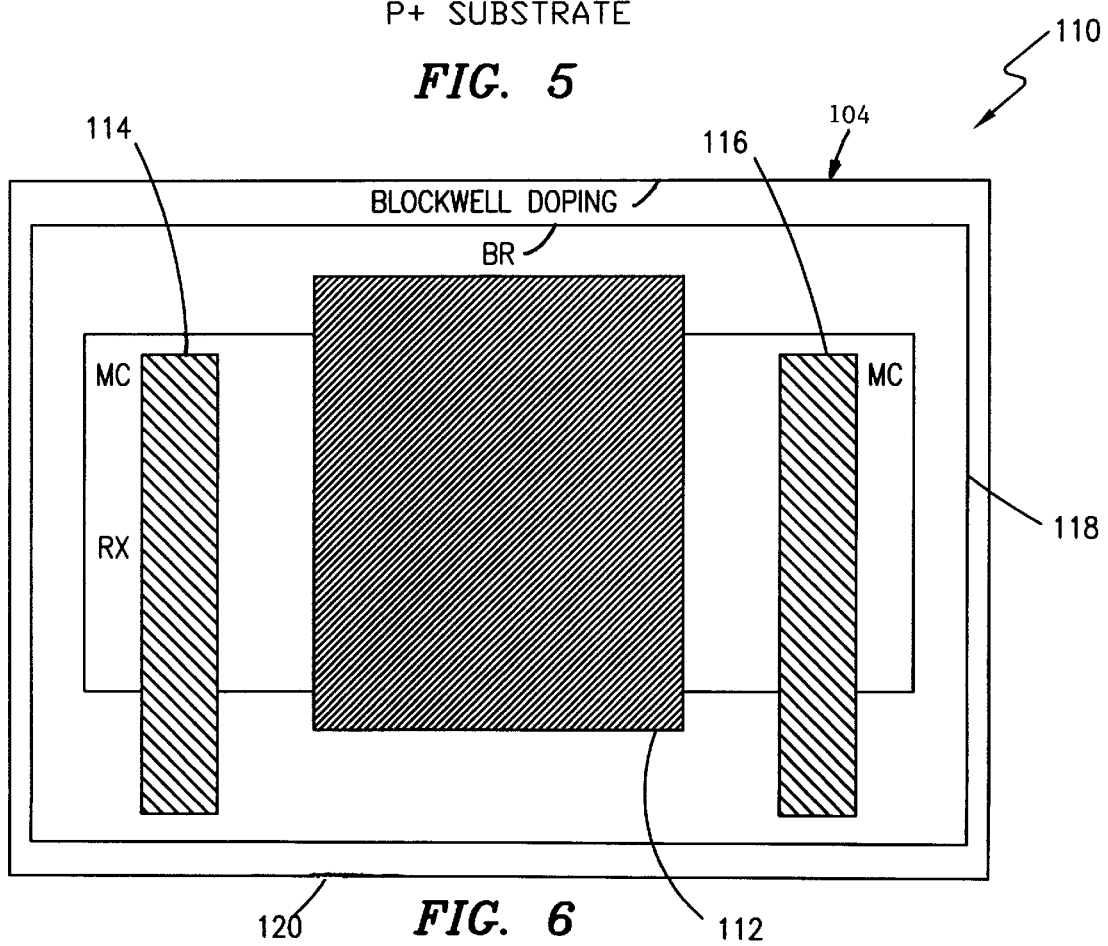
FIG. 6 is a layout of a buried capacitor in accordance with the present invention.

FIG. 6 is a layout 110 of a buried capacitor of the present invention. FIG. 6 shows a highly doped polysilicon gate as one terminal and the contacts 114 and 116 connected to the buried diffusion terminal. A block mask 120 over the structure is used to lower the parasitic diffusion junction capacitance between the buried N+ diffusion and the P-type region underneath.

The designed capacitance component of the buried capacitor is between the buried diffusion region and the polysilicon gate.

The advantages of the buried capacitor 90 compared with the prior art is its lower parasitic diffusion-to-P-well junction capacitance.

Figure 7:
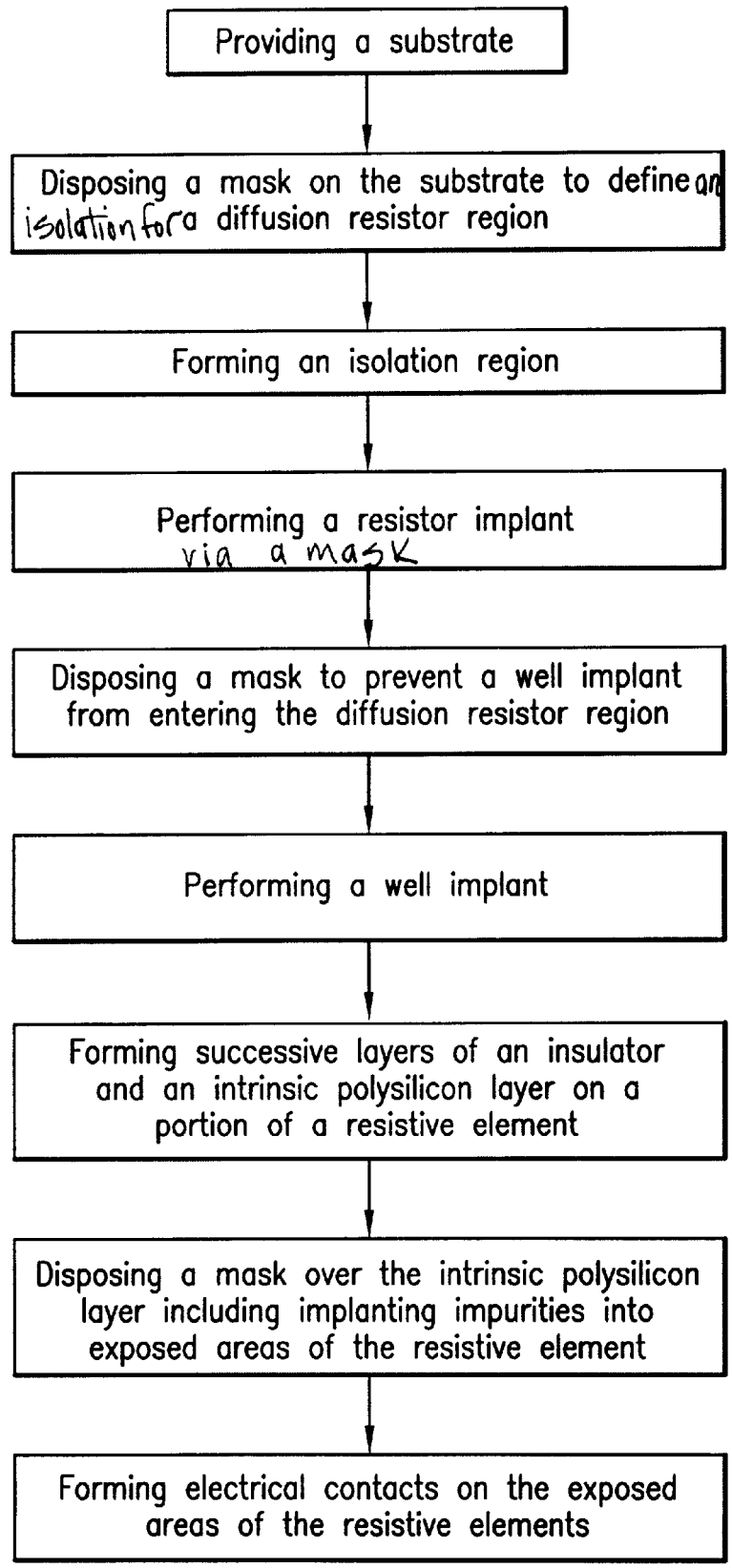
FIG. 7 is a flow chart of the method of making a buried resistor in accordance with the present invention.

FIG. 7 is a flow chart of the method of forming a buried resistor in accordance with the present invention. The method of forming a buried capacitor is the same as the buried resistor except that the source/drain blocking mask does not cover any part of the capacitor.

While the invention has been described in terms of a single preferred embodiment, those skilled in the art will recognize that the invention can be practiced with modification within the spirit and scope of the appended claims. For example, this invention also applies to the case where the substrate can be bulk silicon or SOI (silicon on insulator). Furthermore, the substrate can be N-type, and the buried resistor is P-type. In this case, the disclosed P-well becomes an N-well.

What is claimed is:

1. A method of forming a buried resistor comprising the steps of:

providing a substrate of a first type impurity;

disposing a first mask on the substrate to define a buried resistor region in the substrate;

forming an isolation region in the substrate around the buried resistor region;

performing a resistor formation implant having a second type impurity in the buried resistor region;

disposing a second mask to block a well implant of the first type impurity from entering the buried resistor region;

performing said well implant of the first type impurity;

forming an insulator layer on a portion of the buried resistor region;

forming a polysilicon layer on the insulator layer:

disposing a blocking mask over the polysilicon layer; and implanting the second type impurity into terminal regions of the buried resistor region.

2. The method of clam 1, further comprising the step of:

forming electrical contacts on the terminal regions.

* * * * *